(12) United States Patent
Kirchhoff et al.

(10) Patent No.: US 10,431,633 B2
(45) Date of Patent: Oct. 1, 2019

(54) METHOD FOR PRODUCING A MULTI-COLORED LIGHT EMITTING COMPONENT

(71) Applicant: Fraunhofer-Gesellschaft zur Förderung der angewandten Forschung e.V., Munich (DE)

(72) Inventors: Volker Kirchhoff, Wehlen (DE); Uwe Vogel, Dresden (DE); Elisabeth Bodenstein, Dresden (DE); Beatrice Beyer, Dresden (DE); Stefan Saager, Dresden (DE); Karsten Fehse, Dresden (DE); Bernd Richter, Dresden (DE); Philipp Wartenberg, Dresden (DE); Mario Metzner, Königsbrück (DE); Christoph Metzner, Dresden (DE); Matthias Schober, Dresden (DE); Susan Mühl, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/058,531

(22) Filed: Aug. 8, 2018

(65) Prior Publication Data

US 2019/0067382 A1  Feb. 28, 2019

(30) Foreign Application Priority Data

Aug. 23, 2017 (DE) .......... 10 2017 119 311

(51) Int. Cl.
*H01L 27/32* (2006.01)
*H01L 27/15* (2006.01)
(Continued)

(52) U.S. Cl.
CPC ........ *H01L 27/3211* (2013.01); *H01L 27/156* (2013.01); *H01L 33/005* (2013.01);
(Continued)

(58) Field of Classification Search
None
See application file for complete search history.

(56) References Cited

U.S. PATENT DOCUMENTS 6,120,338 A * 9/2000 Hirano .................. H05B 33/10
313/505
6,146,715 A * 11/2000 Kim ..................... H01L 27/3211
216/17
(Continued)

FOREIGN PATENT DOCUMENTS

DE    101 17 663 A1    10/2002
WO    WO 99/03157 A1    1/1999

OTHER PUBLICATIONS

Jang Hyuk Kwon et al., "High-Performance Organic Light-Emitting Diode Displays," Applications of Organic and Printed Electronics, Online ISBN 978-4614-3160-2, dated 2013, pp. 57-81, published by Springer Science+Business Media, New York, NY.

*Primary Examiner* — Andres Munoz
(74) *Attorney, Agent, or Firm* — Brinks Gilson & Lione

(57) ABSTRACT

A method for producing a component is provided, where the component comprises a substrate, which emits at least one electromagnetic radiation in a first wavelength range and an electromagnetic radiation in a second wavelength range within one surface area. Electrodes can be formed within the surface area of the substrate; a first layer stack can be deposited, comprising at least one layer, which causes the emission of the electromagnetic radiation in the first wavelength range, and a cover layer, acting as the first counter-electrode, on the entire surface area; the first layer stack can be removed from a first partial surface area, which com-
(Continued)

prises at least one electrode; a second layer stack can be deposited, comprising at least one layer, which causes the emission of the electromagnetic radiation in the second wavelength range, and a second cover layer, acting as the counterelectrode, on the entire surface area.

15 Claims, 7 Drawing Sheets

(51) Int. Cl.
  *H01L 33/00* (2010.01)
  *H01L 51/56* (2006.01)
  *H01L 51/50* (2006.01)
(52) U.S. Cl.
  CPC ............ *H01L 51/504* (2013.01); *H01L 51/56* (2013.01); *H01L 2251/558* (2013.01)

(56) References Cited

U.S. PATENT DOCUMENTS

| | | | |
|---|---|---|---|
| 6,924,025 B2 | 8/2005 | Humbs | |
| 7,731,860 B2* | 6/2010 | Buckley | H01L 51/0017 |
| | | | 216/24 |
| 9,899,636 B2* | 2/2018 | Defranco | H01L 51/56 |
| 2003/0064323 A1* | 4/2003 | Sato | G03F 7/0035 |
| | | | 430/313 |
| 2005/0032453 A1 | 2/2005 | Tachikawa et al. | |
| 2005/0153058 A1 | 7/2005 | Tachikawa et al. | |
| 2012/0252149 A1* | 10/2012 | Hiroki | H01L 27/3211 |
| | | | 438/34 |
| 2014/0004642 A1 | 1/2014 | Otsuka et al. | |
| 2015/0102294 A1* | 4/2015 | Choi | H01L 51/5203 |
| | | | 257/40 |

* cited by examiner

METHOD FOR PRODUCING A MULTI-COLORED LIGHT EMITTING COMPONENT

CROSS-REFERENCE TO RELATED APPLICATIONS

This application claims priority under 35 USC § 119 to German Patent Application DE 10 2017 119 311.1, filed Aug. 23, 2018, which is hereby incorporated by reference.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
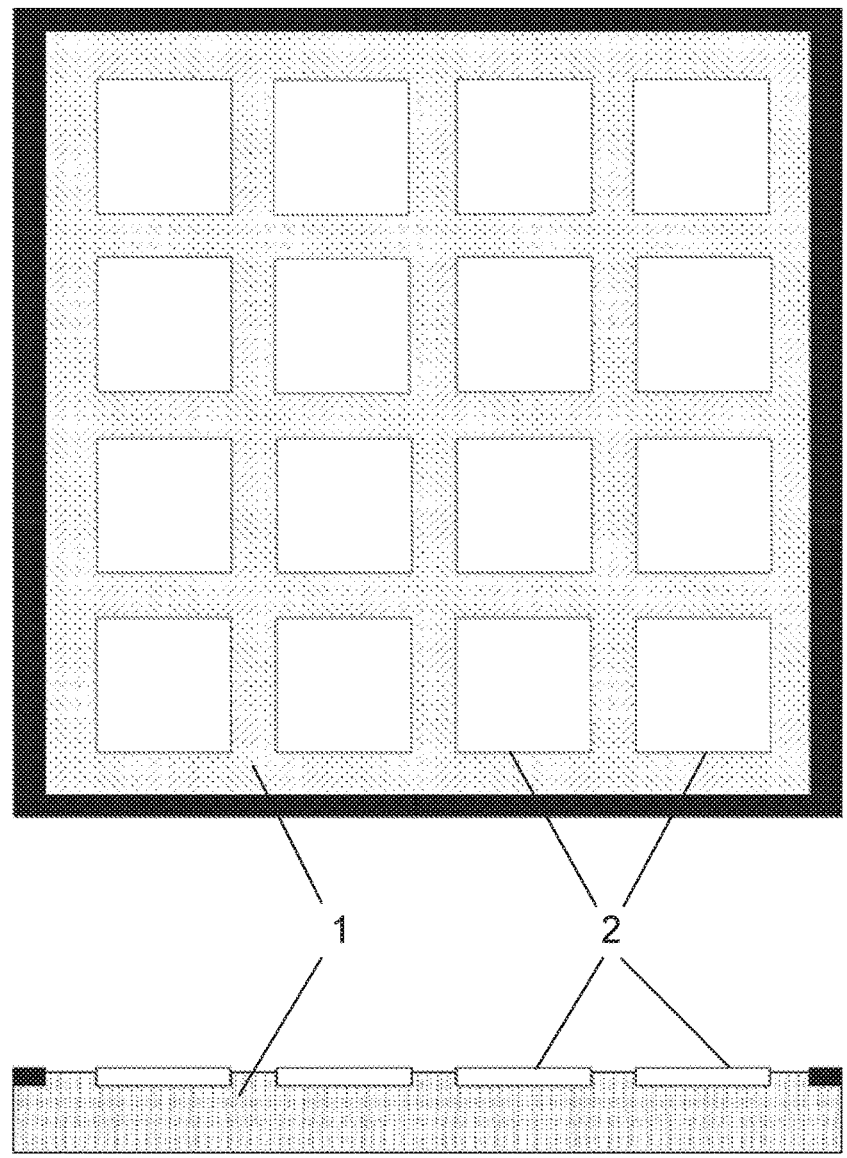
FIG. 1 shows a schematic view of a substrate on which a number of anodes are arranged.
Figure 2:
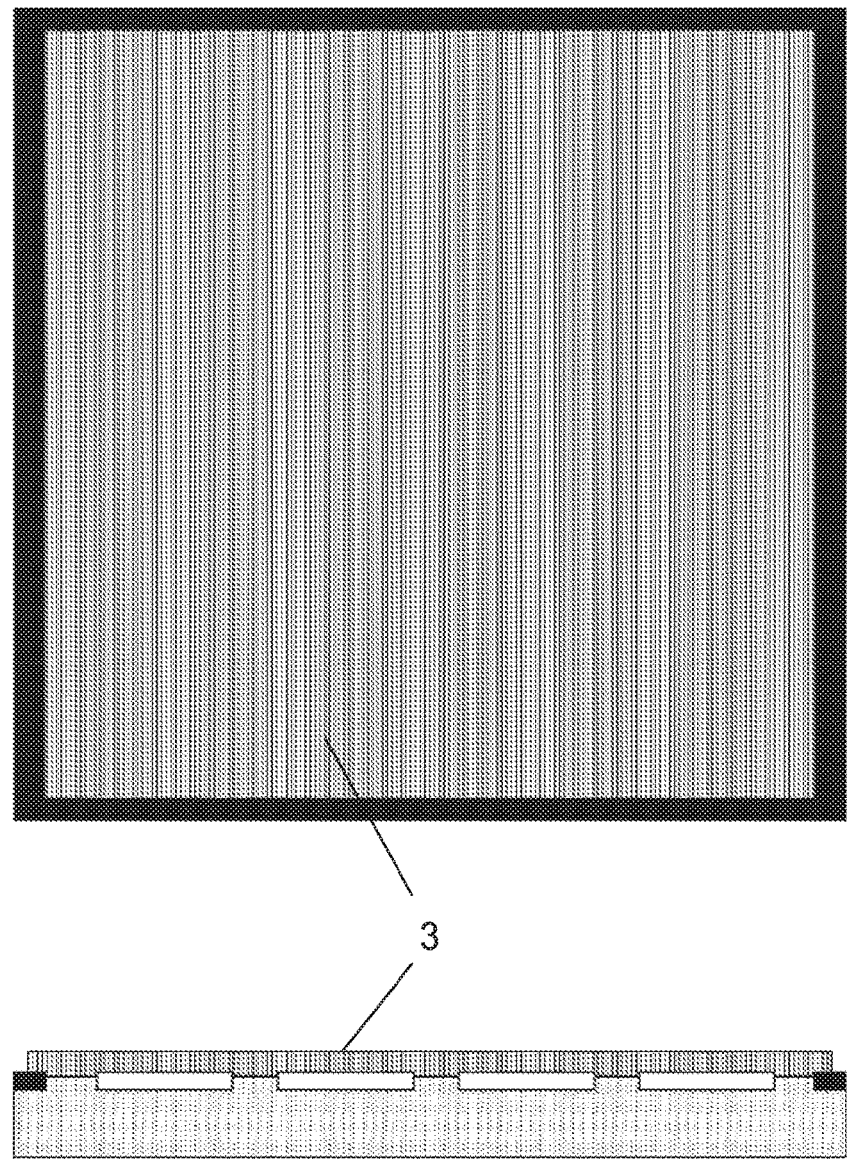
FIG. 2 shows a schematic view of a first layer stack deposited over the entire surface of a surface area of a substrate.

The disclosure relates to a method for producing a component having a surface that can emit, in general, electromagnetic radiation in at least two wavelength ranges and, in particular, light comprising at least two colors. The method can be used, in particular, for the production of components that emit light in the visible wavelength range in various colors, wherein the individual surface segments, from which light is emitted in one color, are formed very small, as required, for example, in full color displays, where light in the colors red (R), green (G) and blue (B) is emitted from very small surface areas (also referred to as pixels). However, the method can also be used to produce components for purposes of illumination.

In essence, two methods for the fabrication of RGB displays have become widely accepted. When a so-called shadow mask technology is used, various light emitting materials are deposited next to one another in a selective manner (E. Cantatore, Applications of Organic and Printed Electronics, ISBN: 978-1-4614-3159-6, J. H. Kwon, R. Pode, H. Dong Kim, H. K. Chung, article 3.5.2, Pixel Patterning Technology, pp. 67-70). In this case, a structured thin plate or film (the shadow mask) is used to separate those surface areas that are to be coated from such surface areas that are not to be coated. This technology is used primarily for coatings applied in a vacuum. In this way, it is possible to produce, for example, RGB pixels having structural sizes 30 µm. The layer materials for producing a layer stack, from which electromagnetic radiation is emitted, are applied by vapor deposition through the openings of these shadow masks. However, due to the handling and minimally limited thickness of these shadow masks, structural sizes of less than 30 µm can no longer be produced.

In another known method, the RGB colors are generated indirectly by using RGB color filters that absorb the undesired components of the color spectrum (E. Cantatore, Applications of Organic and Printed Electronics, ISBN: 978-1-4614-3159-6, J. H. Kwon, R. Pode, H. Dong Kim, H. K. Chung, article 3.5.3, White OLED with Color Filter Technology, pp. 70-72). These RGB color filters are produced by photolithography processes and can, therefore, have, in principle, a resolution that allows them to be displayed very small. For this purpose, structural sizes of down to about 5 µm are known. In this procedure, a layer stack for a white light source is initially deposited on a substrate, and the red, green, and blue components of the visible light spectrum are filtered out by depositing corresponding layer systems on partial surface areas above the layer stack for the white light source. In this case the major portion of the emitting light spectrum is not used; and, as a result, the power efficiency of the fabricated component is reduced.

Therefore, inventive methods described herein can be based on a technical problem of providing a method for producing a component, which emits electromagnetic radiation in a plurality of wavelength ranges and with which smaller structural sizes can be realized than by shadow mask technology and which exhibits a higher power efficiency, higher operating brightness and an expanded color space than a component produced by means of color filters.

In an inventive method for producing a component comprising a substrate, which emits at least one electromagnetic radiation in a first wavelength range and an electromagnetic radiation in a second wavelength range within one surface area, the first step is to provide the substrate, on the surface of which a plurality of electrodes are formed within the surface area. One example of a substrate that can be used is a silicon wafer backplane, which is known from the prior art. A first layer stack, which comprises at least one layer, which causes the emission of the electromagnetic radiation in the first wavelength range, and comprises a cover layer, acting as the first counterelectrode, is deposited on the entire surface area of the substrate. Then the first layer stack is removed again from a first partial surface area, which comprises at least one electrode. Subsequently a second layer stack, which comprises at least one layer, which causes the emission of the electromagnetic radiation in the second wavelength range, and a second cover layer, acting as the counterelectrode, is deposited on the entire surface area of the substrate. Finally an electrically conductive connection is also produced between the first and second cover layer that acts as the counterelectrode.

At this point, the substrate exhibits first partial surface areas within the surface area; and only the second layer stack is deposited on said first partial surface areas. In the partial surface areas outside the first partial surface areas the first layer stack and, above this, the second layer stack are deposited on the substrate. If an electric voltage is applied between the electrodes, located on the substrate surface, and the cover layers of the first and second layer stack, with the cover layers acting as the counterelectrode, then the electromagnetic radiation in the second wavelength range is radiated in the first partial surface areas, in which, of course, only the second layer stack is located; and only the electromagnetic radiation in the first wavelength range is radiated in the partial surface areas outside the first partial surface areas. Although the second layer stack is also deposited over the first layer stack in the partial surface areas outside the first partial surface areas, because, however, the cover layers of the first layer stack and the second layer stack are connected to one another in an electrically conductive manner, with the cover layers acting as the counterelectrodes, and, thus, are short circuited, no electromagnetic radiation in the second wavelength range is emitted from the second layer stack in the partial surface areas outside the first partial surface areas.

The advantageous aspect of the method of the present invention can be that all of the layer stacks for emitting electromagnetic radiation are deposited, first of all, over the entire surface of a surface area of a substrate, and not until after the layer deposition are they structured. In addition, the structuring of a layer stack after the layer deposition makes it possible to achieve structural sizes that are smaller than those achieved by methods, in which the layer stacks, which are structured the same and are intended for emitting electromagnetic radiation, are applied on a substrate, for example, by means of masking processes. In order to structure a layer stack, thus, to remove a layer stack from a partial surface area, it is possible to use, for example, an energy beam. Some examples of a suitable energy beam include an electron beam, an ion beam and, in particular, also a laser beam. If a laser beam is used to remove a layer stack from a partial surface area, then it can be advantageous for the method of the present invention if a material, which has a high reflectance with respect to the wavelength of the laser beam that is employed, is used to form the electrodes, which are disposed on the surface of the substrate.

In one embodiment, an energy beam for removing a layer stack from a partial surface area is generated by means of at least one flash lamp. The removal of a layer stack from a partial surface area can also be carried out, for example, by arranging a mask over the substrate prior to the removal of the layer stack.

The inventive method can also suitable for producing components having surfaces that emit electromagnetic radiation in more than only two different wavelength ranges. If, for example, the objective is also to emit electromagnetic radiation in a third wavelength range from the above described surface area of a substrate, then the process steps, which have already been described above, are followed by the following process steps:

the second layer stack is removed from a second partial surface area, which comprises at least one electrode.

In this context, the second partial surface area is located within the first partial surface area, i.e., a partial surface area, in which only the second layer stack is deposited on the substrate. Then a third layer stack is deposited over the whole surface of the total surface area of the substrate, wherein the third layer stack comprises at least one layer, which causes the emission of an electromagnetic radiation in a third wavelength range, and a third cover layer, which acts as a counterelectrode. Finally, an electrically conductive connection is produced between the first, second and third cover layer that acts as a counterelectrode.

At this point, the surface area of the substrate comprises partial areas, on which only the third layer stack is deposited on the substrate. Furthermore, said surface area comprises partial surface areas, on which the second layer stack and, above this, the third layer stack are deposited; and said surface area comprises partial surface areas, on which the first layer stack, above this, the second layer stack and, above this, the third layer stack are deposited.

For the sake of completeness, it should be noted that it is also possible, in accordance with the present disclosure, to produce a component that can emit electromagnetic radiation having more than three different wavelength ranges.

Because the cover layers of all of the layer stacks that are deposited one above the other are connected to one another in an electrically conductive manner, with the cover layers acting as the counterelectrode, and, thus, are short circuited, just that layer stack alone that is deposited directly on the substrate emits in the different partial areas. Unfortunately this aspect also results in a disadvantage. For example, in the partial areas, in which first a first layer stack, then a second layer stack followed by a third layer stack are deposited on a substrate in such a way that they lie one above the other and in which electromagnetic radiation is emitted only from the first layer stack, the electromagnetic radiation, emitted from the first layer stack, has to first pass is through the second and third layer stack lying above said first layer stack, a feature that is associated with an absorption of a part of the electromagnetic radiation. However, there exist layer stacks in the prior art that are designed to emit electromagnetic radiation and have a high transparency, so that the disadvantage can be ignored in many applications.

For this reason it is, however, advantageous if the order of sequence, in which the layer stacks are deposited one above the other, is selected as a function of their radiation yield, so that the layer stack, of which the emitted electromagnetic radiation has the highest radiation yield, is deposited on the substrate as the first layer stack. In this case, the radiation yield is the ratio of the emitted radiant power to the absorbed electrical power of a layer stack.

In an additional embodiment, the order of the sequence in which the layer stacks are deposited one above the other is selected as a function of the transparency of a layer stack with respect to the emitted electromagnetic radiation of the other layer stacks. This means the layer stack that has the highest transparency with respect to the emitted electromagnetic radiations of the other layer stacks is deposited as the uppermost layer stack.

There exist in the prior art a wide range of layer stacks that are designed for emitting electromagnetic radiation and that are also suitable for the inventive methods described here. Layer stacks comprising organic layers are becoming increasingly important. Only for the sake of mentioning some examples and without any claim to completeness, the following is a list of some of these layers, which comprise such a layer stack, with their English language technical terms and associated abbreviations in parentheses: hole injection layer (HIL), hole transport layer (HTL), electron blocking layer (EBL), emission layer (EML), hole blocking layer (HBL), electron transport layer (ETL). However, as an alternative, the known layer stacks that are designed for emitting electromagnetic radiation and that comprise inorganic layers can also be suitable for the methods described here.

As already explained above, the inventive methods can give preference to the use of substrates, on the surface of which a number of electrodes have already been formed and then the layer stacks are deposited thereon, with each layer stack comprising a cover layer that acts as the counterelectrode. In a preferred embodiment, the electrodes that are present on the substrate are formed as the anodes; and the cover layers, which act as the counterelectrode, are formed as the cathodes. However, as an alternative, it is also possible to form the electrodes, present on the substrate, as the cathodes and to form the cover layers, acting as the counterelectrode, as the anodes.

An example embodiment is described in detail below. FIGS. 1 to 7 show schematic views of the fabrication steps of a component, which is produced in accordance with the invention and which emits the colors red, green and blue in partial areas on its surface. In this context, FIGS. 1 to 7 respectively show in schematic form a plan view at the top and a cross section of the component at the bottom after a respective process step.

Figure 3:
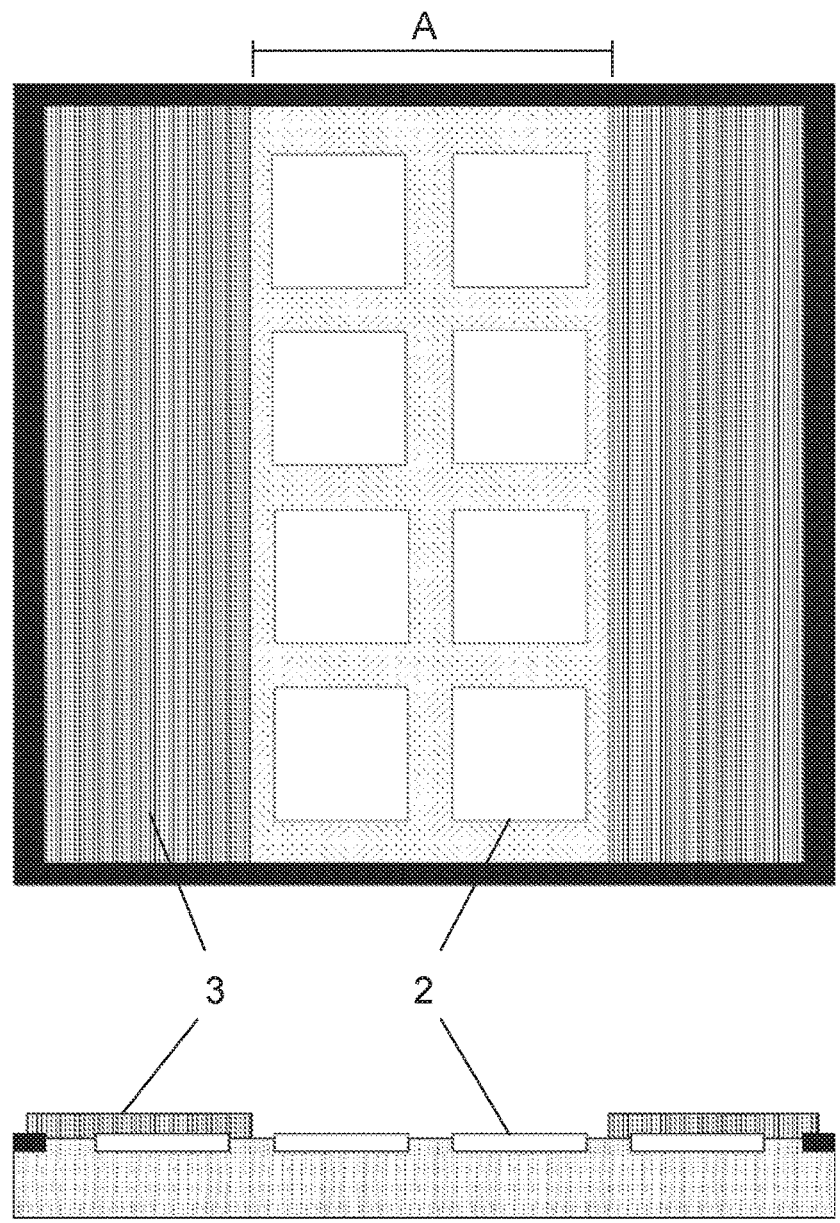
FIG. 3 shows a schematic view of a first layer stack removed from a first partial area of the substrate surface area.

FIG. 1 shows a schematic view of a provided substrate 1, on the surface of which a number of anodes 2 are arranged. In the exemplary embodiment, the substrate 1 is formed as a silicon wafer backplane, known from the prior art. A first layer stack 3, which is known from the prior art, is deposited, according to the invention, over the entire surface of a surface area of the substrate 1 with the known process steps, as shown in schematic form in FIG. 2. The layer stack 3 comprises at least one organic layer, which emits light having the color red, and a cathode cover layer. FIG. 3 shows that the first layer stack 3 is then removed from a first partial area having the width A of the substrate surface area by means of a laser beam. As can also be seen in FIG. 3, the partial area with the width A comprises a number of anodes 2 on the substrate surface.

Figure 4:
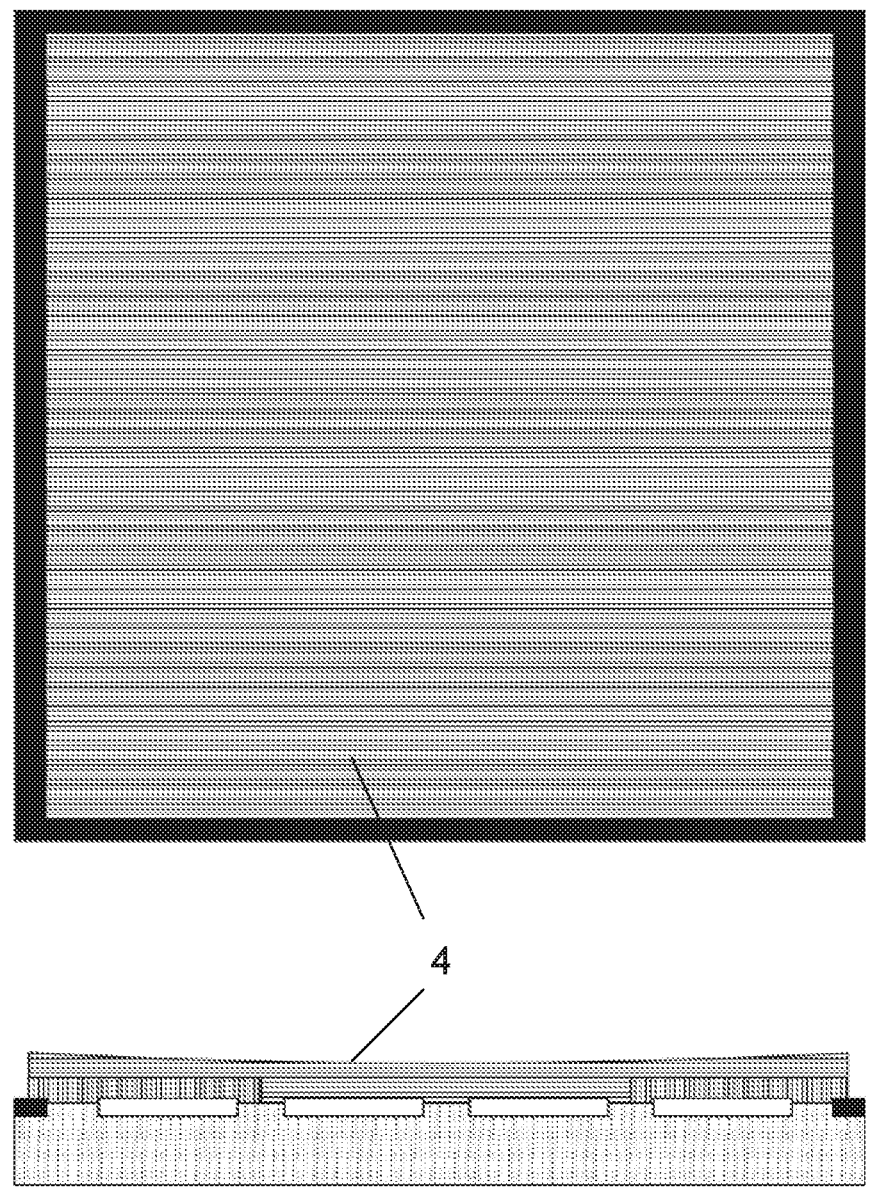
FIG. 4 shows a schematic view of a second layer stack deposited over the entire surface of the total surface area of the substrate.

Subsequently, a second layer stack 4, which is known from the prior art, is deposited over the entire surface of the total surface area of the substrate 1 with the known process steps, as shown in schematic form in FIG. 4. The layer stack 4 comprises at least one organic layer, which emits light having the color green, and a cathode cover layer.

Figure 5:
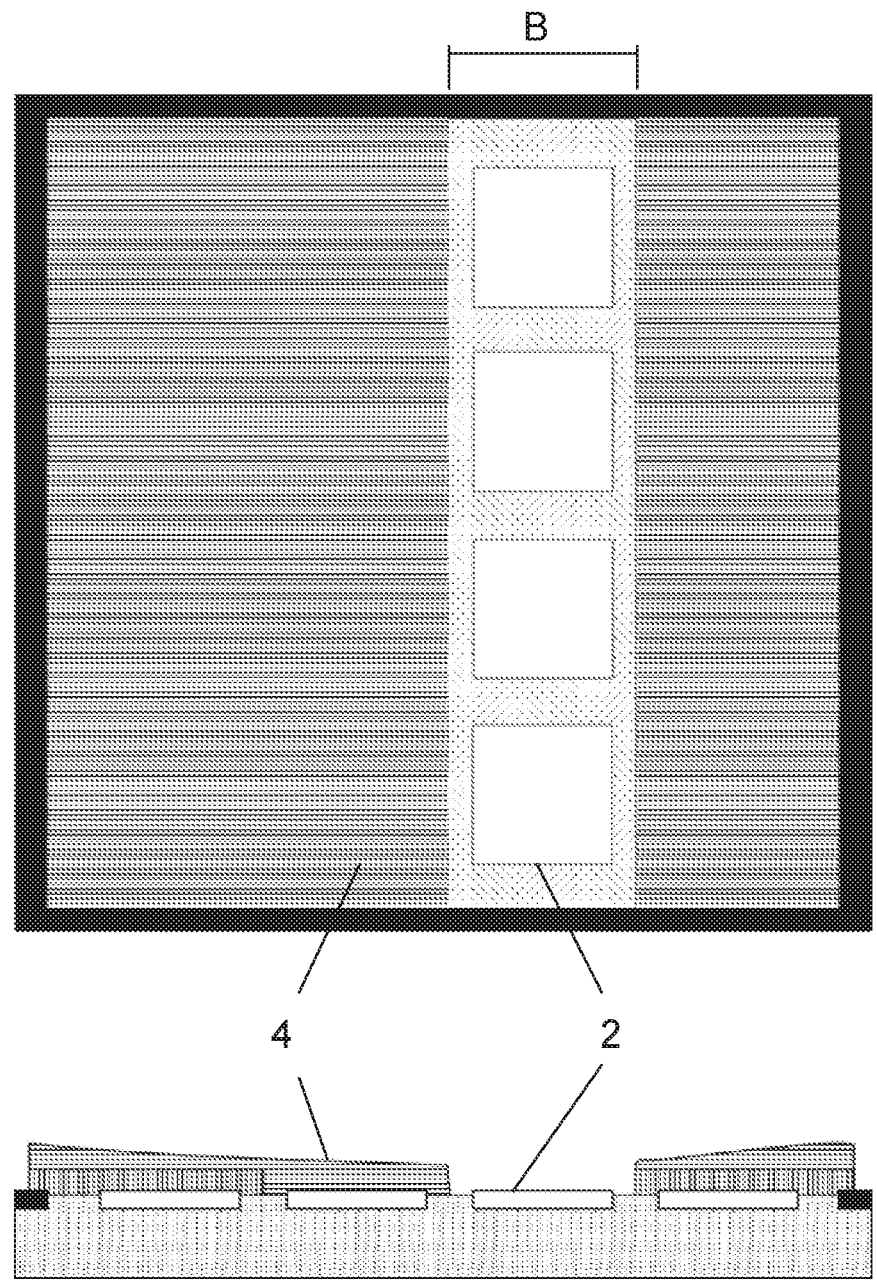
FIG. 5 shows a schematic view of a second layer stack removed from a second partial area of the substrate surface area.

FIG. 5 shows that the second layer stack 4 is subsequently removed from a second partial area having the width B of the substrate surface area by means of a laser beam. As can also be seen in FIG. 4, the partial area with the width B comprises a number of anodes 2 on the substrate surface.

Figure 6:
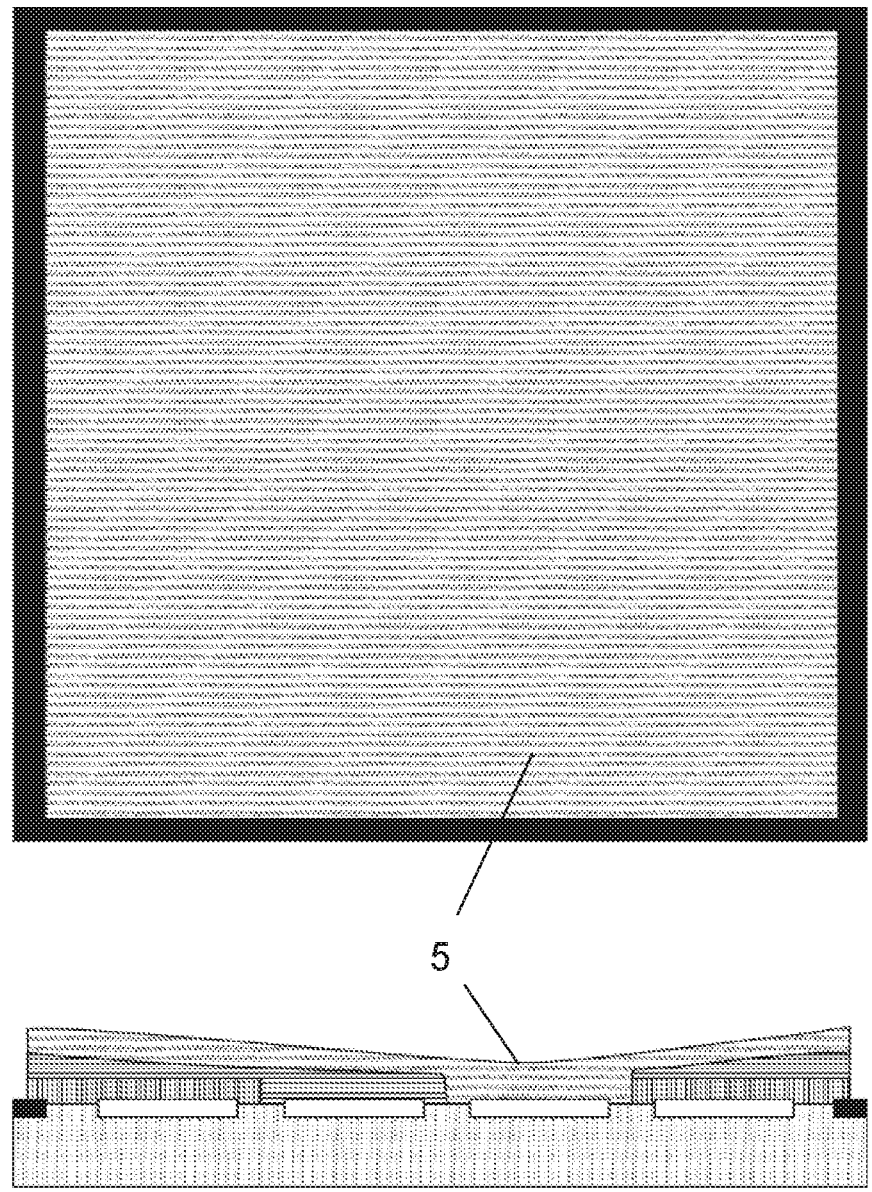
FIG. 6 shows a schematic view of a third layer stack deposited over the entire surface of the total surface area of the substrate.
Figure 7:
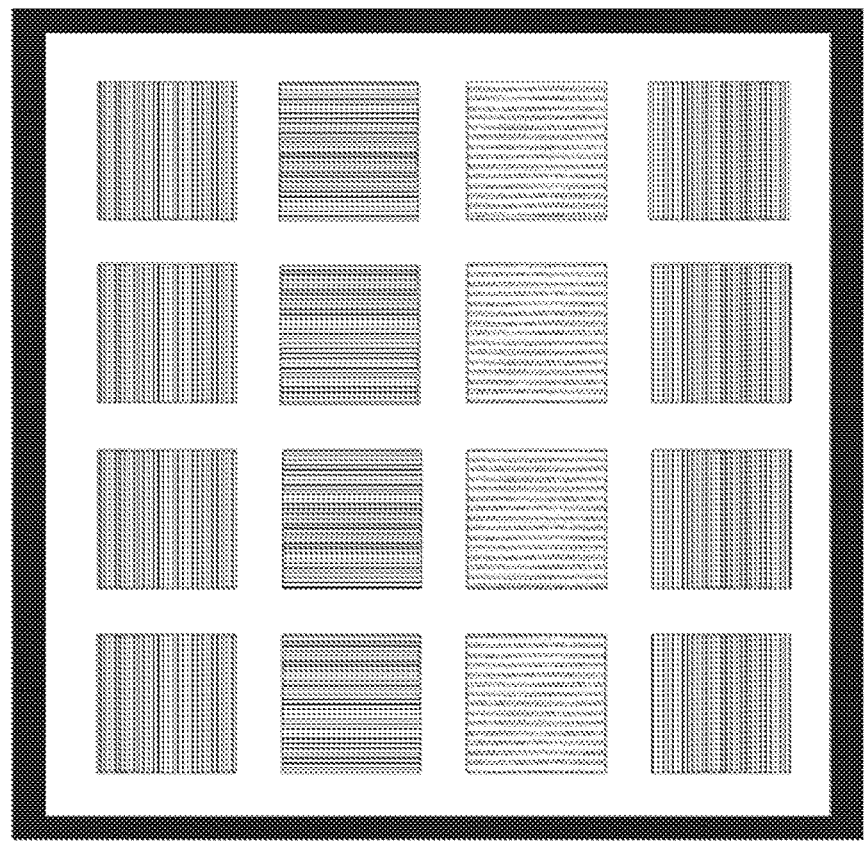
FIG. 7 shows a schematic view of electrically conductive connections, which run along the layer edges and are produced between the cathode cover layers of a first layer stack, a second layer stack, and a third layer stack.
Figure 7:
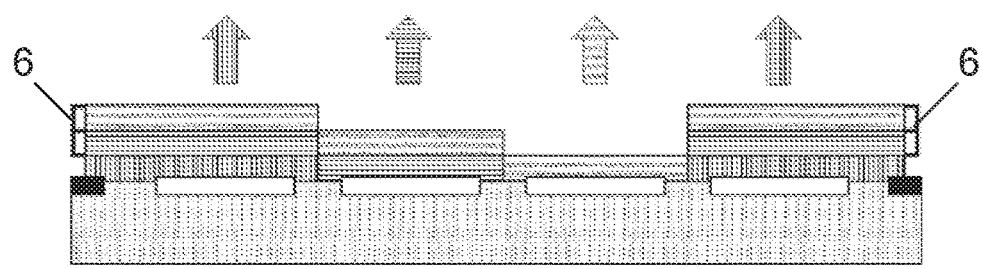

Afterwards, a third layer stack 5, which is known from the prior art, is deposited over the entire surface of the total surface area of the substrate 1 with the known process steps, as shown in schematic form in FIG. 6. The layer stack 5 comprises at least one organic layer, which emits light having the color blue, and a cathode cover layer.

Finally, electrically conductive connections 6, which can run, for example, along the layer edges, are also produced between the cathode cover layers of the first layer stack 3, the second layer stack 4 and the third layer stack 5; and, thus, the cathode cover layers are electrically short circuited. If at this point an electrical voltage is applied between the anodes 2 and the cathode cover layers, then the surface segments of the substrate 1, said segments being covered with an anode 2, emit light in a color of that layer stack 3, 4 or 5 that is directly adjacent to a respective anode 2.

With the inventive method, it can be possible to produce components in which the structure of the individual color surface areas is smaller than that produced by using production methods with shadow mask technology. For example, it is possible to achieve structural sizes in the one digit micrometer range. Furthermore, the power efficiency of components, produced in accordance with the invention, can be higher than the power efficiency of components that are produced by means of the color filter technology.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A method for producing a component comprising a substrate configured to emit an electromagnetic radiation in a first wavelength range and an electromagnetic radiation in a second wavelength range within one surface area, the method comprising:
    providing the substrate having a surface on which a plurality of electrodes are formed within the one surface area;
    depositing a first layer stack on the entire one surface area, the first layer stack comprising at least one layer configured to cause emission of the electromagnetic radiation in the first wavelength range, and a first cover layer;
    removing the first layer stack from a partial surface area comprising at least one of the electrodes;
    depositing a second layer stack on the entire one surface area after the first layer stack was removed from the partial surface area, the second layer stack comprising at least one layer configured to cause emission of the electromagnetic radiation in the second wavelength range and a second cover layer; and
    producing an electrically conductive connection between the first and second cover layers, the first and second cover layers configured to act as a counterelectrode, wherein the at least one layer of the second layer stack deposited on the first layer stack is short circuited so as not to emit the electromagnetic radiation in the second wavelength range.

2. The method of claim 1 further comprising:
    removing the second layer stack from a second partial surface area comprising at least one of the electrodes;
    depositing a third layer stack over the entire one surface area, the third layer stack comprising at least one layer configured to cause emission of an electromagnetic radiation in a third wavelength range and a third cover layer; and
    producing an electrically conductive connection between the first, the second, and the third cover layers the first, the second, and the third cover layers configured to act as the counterelectrode.

3. The method of claim 1, wherein removing the first layer stack comprises removing the first layer stack using an energy beam.

4. The method of claim 3, wherein the energy beam comprises an electron beam.

5. The method of claim 3, wherein the energy beam comprises a laser beam.

6. The method of claim 3, wherein the energy beam comprises an ion beam.

7. The method of claim 3, wherein at least one flash lamp is used to generate the energy beam.

8. The method of claim 1, further comprising arranging a mask over a portion of the one surface area prior to the removal of the first layer stack from the partial surface area and/or prior to removal of the second layer stack from a second partial surface area.

9. The method of claim 1, wherein the substrate comprises a silicon wafer backplane.

10. The method of claim 1, wherein the electrodes are formed as anodes, and the first and second cover layers are formed as a cathode.

11. The method of claim 1, wherein the electrodes are formed as cathodes, and the first and second cover layers are formed as an anode.

12. The method of claim 1, wherein the at least one layer of each of the first and second layer stacks configured to emit electromagnetic radiation is formed as an organic layer.

13. The method of claim 1, wherein the at least one layer of each of the first and second layer stacks configured to emit electromagnetic radiation is formed as an inorganic layer.

14. The method of claim 1, wherein a layer stack of the first and second layer stacks whose at least one layer configured to emit electromagnetic radiation has the greatest radiation yield of the first and second layer stacks is deposited as the first layer stack.

15. The method of claim 1, wherein a layer stack of the first and second layer stacks that exhibits the highest transparency with respect to the electromagnetic radiation emitted by the other of the first and second layer stacks is deposited as an uppermost layer stack.

* * * * *